(12) United States Patent
Peng

(10) Patent No.: US 7,491,559 B2
(45) Date of Patent: Feb. 17, 2009

(54) LOW-TEMPERATURE POLYSILICON DISPLAY AND METHOD FOR FABRICATING SAME

(75) Inventor: Chia-Tien Peng, Jhubei (TW)

(73) Assignee: AU Optronics Corporation, Hsinchu (TW)

( * ) Notice: Subject to any disclaimer, the term of this patent is extended or adjusted under 35 U.S.C. 154(b) by 173 days.

(21) Appl. No.: 11/270,373

(22) Filed: Nov. 8, 2005

(65) Prior Publication Data

US 2007/0105287 A1    May 10, 2007

(51) Int. Cl.
*H01L 21/00* (2006.01)
(52) U.S. Cl. ......................................... 438/30; 438/487
(58) Field of Classification Search ................... 438/30, 438/486, 487
See application file for complete search history.

(56) References Cited

U.S. PATENT DOCUMENTS

| | | | |
|---|---|---|---|
| 5,744,824 A | 4/1998 | Kousai et al. .................. 257/74 |
| 6,165,875 A | 12/2000 | Fonash et al. ................. 438/486 |
| 6,835,606 B2* | 12/2004 | Peng et al. ..................... 438/154 |
| 7,184,106 B2 | 2/2007 | Peng ............................ 349/42 |
| 2004/0087118 A1 | 5/2004 | Maegawa et al. ............ 438/514 |
| 2004/0180481 A1 | 9/2004 | Voutas et al. ................. 438/166 |
| 2005/0070035 A1* | 3/2005 | Yazaki et al. .................. 438/22 |
| 2005/0105037 A1* | 5/2005 | Kim et al. ..................... 349/151 |
| 2005/0173709 A1* | 8/2005 | Lee et al. ....................... 257/79 |
| 2006/0054896 A1 | 3/2006 | Van Der Zang et al. ....... 257/79 |

OTHER PUBLICATIONS

Asia Display/IMID 04 Proceedings; Nakajima et al.; "The Latest Poly-Si TFT Circuit Technologies for System-On-Glass LCD"; pp. 1-6; 2004.

* cited by examiner

*Primary Examiner*—W. David Coleman
(74) *Attorney, Agent, or Firm*—Ware, Fressola, Van Der Sluys & Adolphson, LLP

(57) ABSTRACT

A display panel comprising at least one display area and one peripheral circuit area having electronic components for driving the display components in the display area. The electronic components in the display area are fabricated substantially on a polysilicon layer converted from amorphous silicon by a solid phase crystallization process, whereas the electronic components in the peripheral circuit area are fabricated substantially on a polysilicon layer converted from amorphous silicon first by the solid phase crystallization process and then by laser annealing. As such, display area has a more uniform poly-Si layer substantially free of defects associated with laser annealing, and the peripheral circuit has a poly-Si layer with higher electron mobility.

21 Claims, 4 Drawing Sheets

LOW-TEMPERATURE POLYSILICON DISPLAY AND METHOD FOR FABRICATING SAME

FIELD OF THE INVENTION

The present invention relates generally to a display panel having a display area and an electronic circuit area and, more particularly, to a display panel made substantially of low-temperature polysilicon.

BACKGROUND OF THE INVENTION

Polysilicon (poly-Si) thin-film transistors (TFTs) have been used in a flat-panel display such as an active matrix liquid crystal display (AMLCD) panel. The channel films for this type of display are typically deposited in the amorphous phase and then crystallized to form smooth, large grain polysilicon. In particular, solid-phase crystallization (SPC) is a promising technique for converting amorphous silicon (a-Si) into polysilicon. The crystallization from an amorphous phase to a poly-crystalline phase occurs through a nucleation process and a grain growth process. In a SPC Si system, it is desirable to achieve the largest possible grains, and therefore, it is desirable to suppress nucleation relative to grain growth. For that reason, SPC is typically carried out in low temperature. SPC using low-temperature furnace annealing requires very long anneal times and thus reduces the throughput of the product. Furthermore, crystalline defects detrimentally effect the performance of TFTs. While rapid thermal annealing (RTA) can increase the throughput, the performance of the TFT using RTA poly-Si is poorer than low-temperature crystallization. Voutsas et al. (U.S. Patent Publication No. 2004/0180481 A1) discloses a method for producing TFTs on a flexible substrate, wherein high-temperature oxidation is applied to a SPC poly-Si material in order to achieve poly-Si of a higher quality. However, this process requires temperatures in the range of 900 to 1150° C.

Laser annealing is another low-temperature annealing technique for converting a-Si into poly-Si. With laser annealing, the electron mobility is high and the overall quality of poly-Si is good. However, due to the instability if the laser beam, the poly-Si area so produced usually has perceptible non-uniformity known as laser mura. For this reason, poly-Si produced by laser annealing is generally not suitable for high-quality display panels.

SUMMARY OF THE INVENTION

The present invention provides a method for producing a display panel on a substrate using LTPS technologies. The display panel comprises at least one display area and one peripheral circuit area having electronic components for driving the display components in the display area. In particular, the electronic components in the display area are fabricated substantially on a polysilicon (poly-Si) layer converted from amorphous silicon by a solid phase crystallization (SPC) process, whereas the electronic components in the peripheral circuit area are fabricated substantially on a polysilicon layer converted from amorphous silicon first by the SPC process and then by laser annealing. As such, display area has a more uniform poly-Si layer substantially free of defects associated with laser annealing, and the peripheral circuit has a poly-Si layer with higher electron mobility.

DETAILED DESCRIPTION OF THE INVENTION

Figure 1:
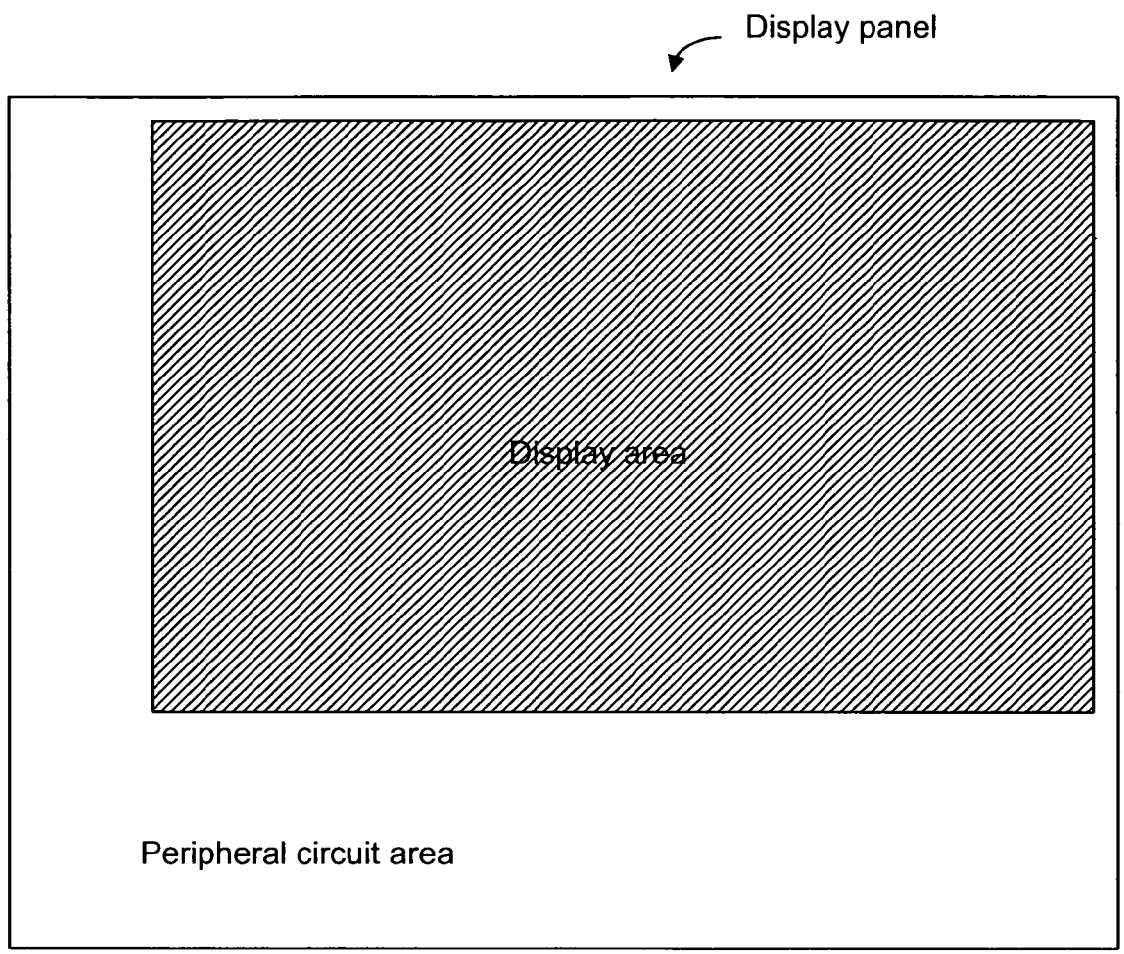
FIG. 1 is a schematic representation of a display panel, according to the present invention.
Figure 2:
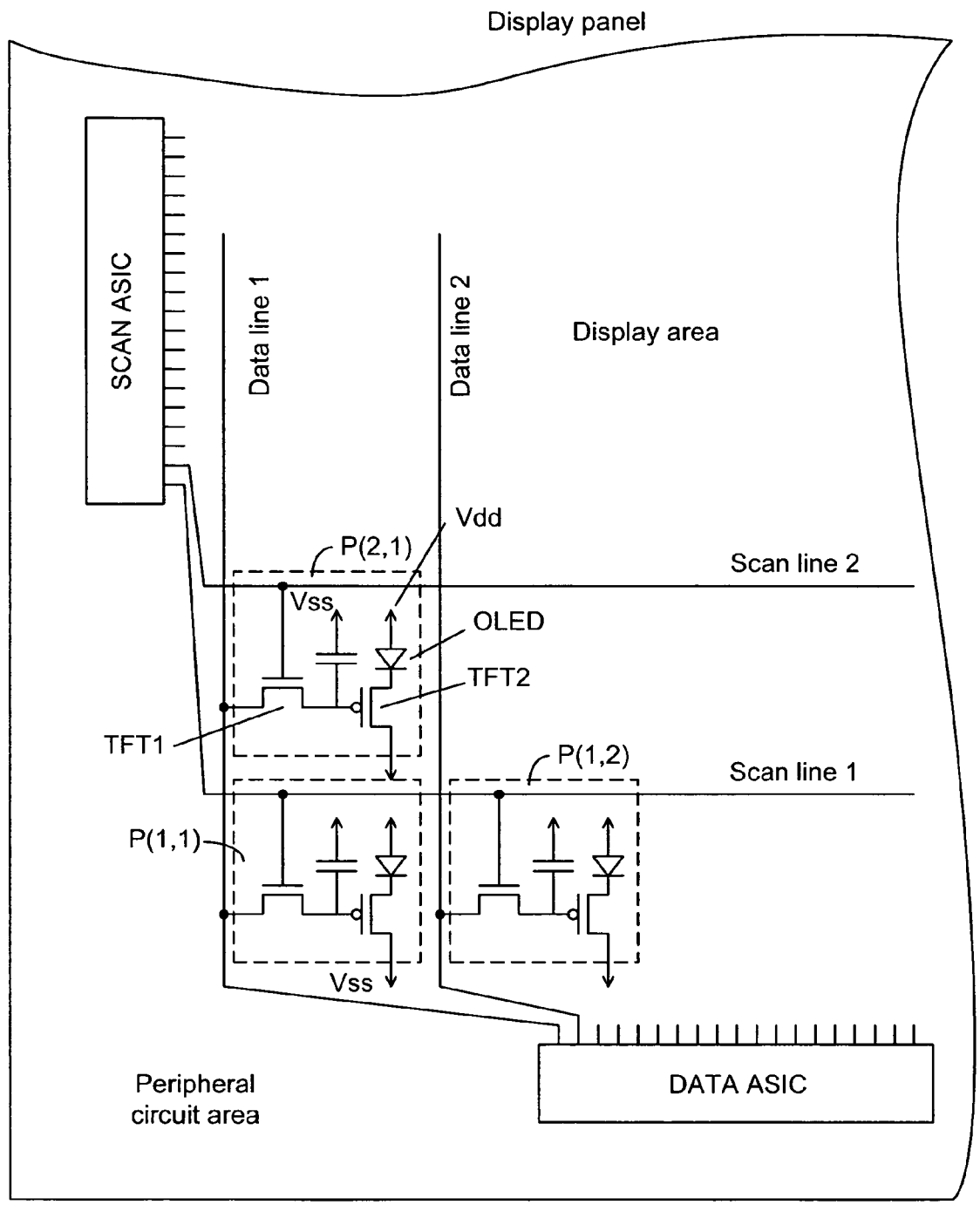
FIG. 2 is a schematic representation of a section of display panel, showing a number of driver ICs in the peripheral circuit area and a number of pixels in the display area.

The present invention uses two different low-temperature polysicon (LTPS) processes to produce a first polysilicon (poly-Si) area and a second poly-Si area on a substrate. The first poly-Si area is mainly used for a display area of a display panel and the second poly-Si area is mainly used for a peripheral circuit area, as shown in FIG. 1. For example, the display panel is an active matrix organic light-emitting diode (AMOLED) panel. The display area comprises a plurality of AMOLED pixels arranged in a two-dimensional array. The peripheral circuit area in the display panel includes a plurality of integrated circuits and bus-lines or connectors to provide data and control signals to the pixels. As shown in FIG. 2, the integrated circuits in the peripheral circuit area include one or more DATA ASICs and one or more SCAN ASICs. The display area comprises a row of pixel (1,1), pixel (1,2), . . . that share a Scan line from the SCAN ASIC, and a column of pixel (1,1), pixel (2,1) . . . that share a Data line from the DATA ASIC. Each of the pixels (1,1), (1,2), (2,1), . . . has a number of switching elements (TFT1 and TFT2) and a light-emitting element (OLED), for example.

Figure 3A:
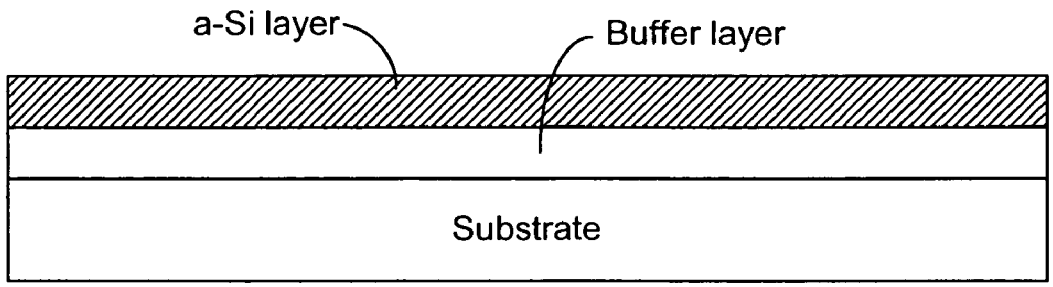
FIG. 3A is a schematic representation showing an amorphous silicon layer along with a buffer layer disposed on a substrate.
Figure 3B:
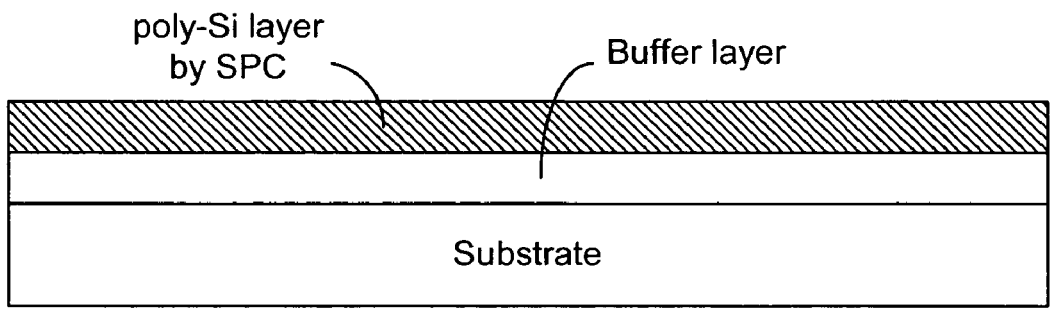
FIG. 3B is a schematic representation showing the amorphous silicon layer converted into a polysilicon layer by solid-phase crystallization.
Figure 3C:
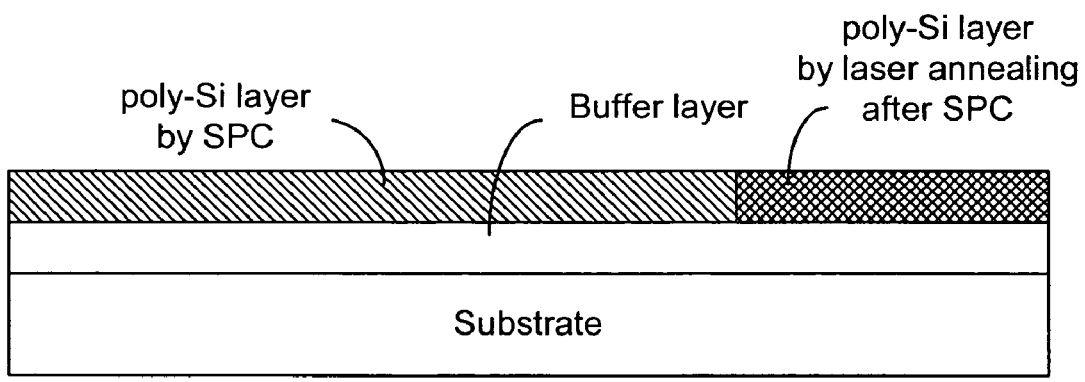
FIG. 3C is a schematic representation showing a section of the polysilicon layer by solid-phase crystallization re-processed by laser annealing.

The polysilicon in the first poly-Si area is converted from amorphous silicon (a-Si) by a solid-phase crystallization (SPC) process. The polysilicon in the second poly-Si area is first converted from a-Si by the SPC process and then annealed by laser annealing. The a-Si to poly-Si conversion process is illustrated in FIG. 3A to FIG. 3C. As shown in FIG. 3A, an a-Si layer and a buffer layer (SiOx or SiNx/SiOx) are disposed on a substrate such as a glass substrate. As shown in FIG. 3B, the entire a-Si layer is converted to a poly-Si layer by SPC. However, only a selected portion of the SPC produced poly-Si is further processed by laser annealing as shown in FIG. 3C.

Figure 4:
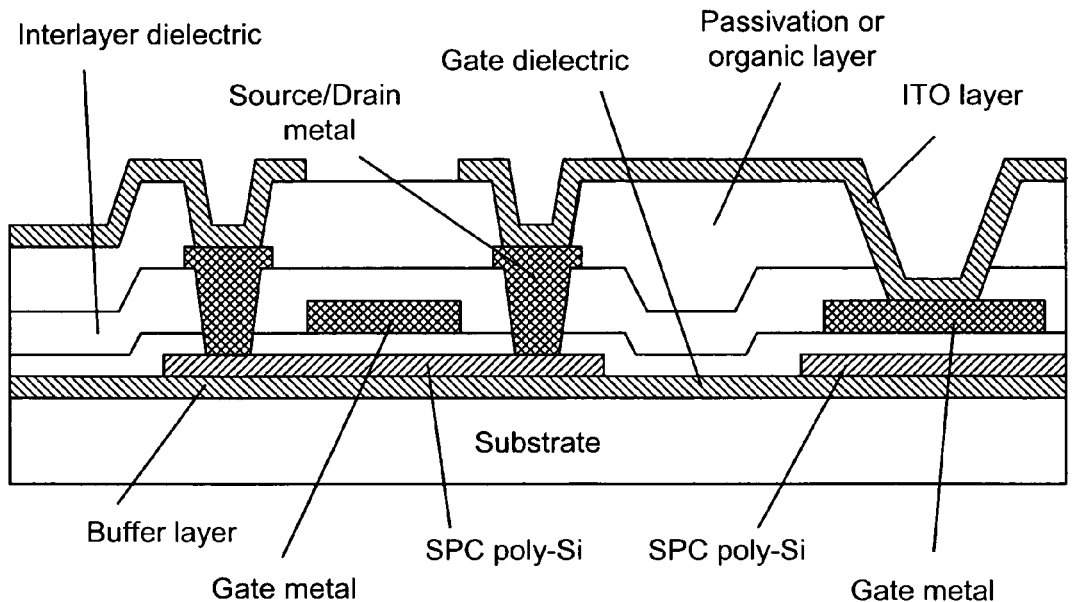
FIG. 4 is a schematic representation of a switching element in the display area fabricated on a SPC poly-Si layer
Figure 5:
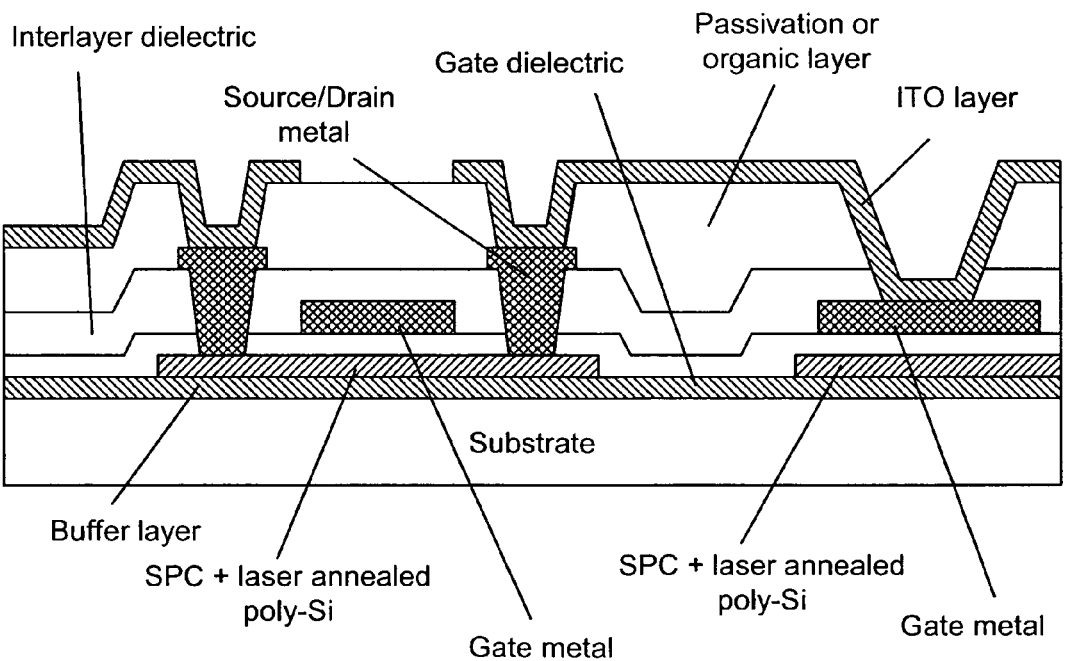
FIG. 5 is a schematic representation of a switching element in the peripheral circuit area fabricated on a laser annealed poly-Si layer.

After the SPC poly-Si area and the laser annealed poly-Si area are produced on the same substrate, various electronic components required for the display area is fabricated in the SPC poly-Si area, as shown in FIG. 4, and various electronic components required for the peripheral circuit are fabricated in laser annealed poly-Si area, as shown in FIG. 5. FIGS. 4 and 5 are schematic representations of a switching element in the display area and the peripheral circuit area, respectively.

Interconnection between the display area and peripheral circuit is achieved by fabricating electrically conductive connectors between the two areas. The fabrication processes for producing electronic components such as TFTs, AMOLEDs and connectors are known in the art.

In sum, in a display panel according to the present invention comprises at least a display area and a peripheral circuit area. Electronic components in the display area are fabricated on a polysilicon (poly-Si) layer converted from amorphous silicon by a solid phase crystallization (SPC) process, whereas electronic components in the peripheral circuit area are fabricated substantially on a polysilicon layer converted from amorphous silicon first by the SPC process and then by laser annealing. As such, the display area has a more uniform poly-Si layer substantially free of defects associated with laser annealing, and the peripheral circuit has a poly-Si layer with higher electron mobility. The interconnection between the display area and the peripheral area can be achieved by electrically conductive connectors.

The display area has a plurality of display elements such as organic light-emitting elements. These display elements can be arranged in a two-dimensional array. The display area further comprises a plurality of switching elements, such as TFTs, for controlling the display elements. The peripheral circuit area has one or more integrated circuits for providing data signals to the display area, and one or more integrated circuits for providing scanning signals to the array.

The properties of the poly-Si layer converted from amorphous silicon by a solid phase crystallization and the properties of the poly-Si layer further converted by laser annealing are summarized in the following table.

|  | SPC-polysilicon | Laser-polysilicon |
| --- | --- | --- |
| Crystalinity | Low | High |
| Uniformity | Better | Poor |
| Threshold voltage | High | Low |
| Mobility | Low | High |
| Grain size | Small | Large |

Typically, the electron mobility of the SPC-polysilicon is smaller than 70 $cm^2$/Vsec, whereas the electron mobility of the laser annealed polisilicon is equal to or greater than 70 $cm^2$/Vsec. Furthermore, the grain size of the SPC-polysilicon is typically in the range of a few hundred angstrom to a few thousand angstrom, whereas the grain size of the laser annealed polysilicon is typically in the range of a few thousand angstrom to a few micrometer, depending on the annealing laser and technology.

It should be noted that the electronic components shown in FIGS. 4 and 5 are for illustration purposes only. Moreover, the display panel as shown in FIG. 1 contains only one display area. However, two or more display areas can be fabricated on the display panel along with the peripheral circuit area.

Thus, although the invention has been described with respect to one or more embodiments thereof, it will be understood by those skilled in the art that the foregoing and various other changes, omissions and deviations in the form and detail thereof may be made without departing from the scope of this invention.

What is claimed is:

1. A method for producing a display panel on a substrate having a first area and a second area, the display panel having a display area in the first area and an electronic circuit area in the second area electrically connected to the display area, the display area comprising display components, the electronic circuit area comprising electronic components, said method comprising the steps of:
    disposing an amorphous silicon layer on the substrate;
    converting the amorphous silicon layer in both the first and second areas into substantially a poly-silicon layer by a solid-phase cystallization process;
    further annealing the poly-silicon layer in the second area by a laser beam for providing a further annealed poly-silicon layer;
    fabricating the display components in the poly-silicon layer in the first area;
    fabricating the electronic components in the further annealed poly-silicon layer in the second area; and
    providing electrical connections between the display area and the electronic circuit area.

2. The method of claim 1, further comprising the step of providing a buffer layer on the substrate before carrying out the disposing step.

3. The method of claim 1, wherein the poly-silicon layer in the first area has an electron mobility smaller than 70 $cm^2$/Vsec and the further annealed poly-silicon layer in the second area has an electron mobility equal to or greater than 70 $cm^2$/Vsec.

4. The method of claim 1, wherein the display components in the first area comprise organic light-emitting elements.

5. The method of claim 1, wherein the electronic components in the second area comprise one or more integrated circuits for providing data signals to the display area.

6. The method of claim 1, wherein the display area comprises display elements arranged in a two-dimensional array, and wherein the electronic components in the second area comprise one or more integrated circuits for providing scanning signals to the array.

7. The method of claim 1, wherein the electronic components in the second area comprise a plurality of thin-film transistors.

8. The method of claim 1, wherein the substrate comprises a glass substrate.

9. The method of claim 4, wherein the display components in the first area further comprise switching elements for controlling the organic light-emitting elements.

10. The method of claim 9, wherein the switching elements comprise thin-film transistors.

11. A display panel comprising:
    a substrate having a first area and a second area;
    a display area in the first area, the display area comprising display components, wherein at least some of the display components are made of poly-silicon having an electron mobility smaller than 70 $cm^2$/Vsec;
    an electronic circuit area in the second area, the electronic circuit area comprising electronic components, wherein at least some of the electronic components are made of poly-silicon having an electron mobility greater than or equal to 70 $cm^2$/Vsec; and
    electrical connectors connecting the electronic area to the display area.

12. The display panel of claim 11, wherein said display components in the first area are made of poly-silicon having a first grain size and electronic components in the second area are made of poly-silicon having a second grain size larger than the first gain size.

13. The display panel of claim 11, wherein the display components in the first area comprise organic light-emitting elements.

14. The display panel of claim 11, wherein the electronic components in the second area comprise one or more integrated circuits for providing data signals to the display area.

15. The display panel of claim 11, wherein the display area comprises a plurality of display elements arranged in a two-dimensional array, and wherein the electronic components in the second area comprise one or more integrated circuits for providing scanning signals to the array.

16. The display panel of claim 11, wherein the electronic components in the second area comprise a plurality of thin-film transistors.

17. The display panel of claim 11, wherein the substrate comprises a glass substrate.

18. The display panel of claim 11, wherein the poly-silicon in the first area is converted from amorphous silicon in a solid-phase crystallization process.

19. The display panel of claim 11, wherein the poly-silicon in the second area is converted from amorphous silicon in a solid-phase crystallization process and further in a laser annealing process.

20. The display panel of claim 13, wherein the display components in the first area further comprise switching elements for controlling the organic light-emitting elements.

21. The display panel of claim 20, wherein the switching elements comprise thin-film transistors.

* * * * *

UNITED STATES PATENT AND TRADEMARK OFFICE
CERTIFICATE OF CORRECTION

PATENT NO. : 7,491,559 B2  Page 1 of 1
APPLICATION NO. : 11/270373
DATED : February 17, 2009
INVENTOR(S) : Chia-Tien Peng It is certified that error appears in the above-identified patent and that said Letters Patent is hereby corrected as shown below:

In column 2, line 21, after "layer" --.-- should be inserted.

In column 2, line 29, "polysicon" should be --polysilicon--.

In column 3, line 44, "polisilicon" should be --polysilicon--.

In column 4, line 64, claim 12, line 5, "gain" should be --grain--.

Signed and Sealed this

Twenty-eighth Day of April, 2009

JOHN DOLL
*Acting Director of the United States Patent and Trademark Office*